United States Patent
Gaffney

(10) Patent No.: US 6,181,404 B1
(45) Date of Patent: Jan. 30, 2001

(54) APPARATUS AND METHOD FOR MOUNTING A LIQUID CRYSTAL DISPLAY (LCD) ASSEMBLY ONTO A PRINTED CIRCUIT BOARD

(75) Inventor: David G. Gaffney, Evanston, IL (US)

(73) Assignee: 3Com Corporation, Rolling Meadows, IL (US)

( * ) Notice: Under 35 U.S.C. 154(b), the term of this patent shall be extended for 0 days.

(21) Appl. No.: 09/031,942

(22) Filed: Feb. 27, 1998

(51) Int. Cl.[7] .................................................. G02F 1/1345
(52) U.S. Cl. .......................... 349/149; 349/150; 349/152; 439/55
(58) Field of Search ....................... 349/58–66, 149–152; 439/55, 59, 62, 67

(56) References Cited

U.S. PATENT DOCUMENTS

| | | | |
|---|---|---|---|
| 4,008,938 | * | 2/1977 | Anhalt et al. ........................... 339/17 |
| 4,423,920 | * | 1/1984 | Cooper et al. ........................ 339/252 |
| 4,629,289 | * | 12/1986 | Streit ..................................... 439/149 |
| 4,976,629 | * | 12/1990 | Werner ................................... 439/71 |
| 5,243,453 | * | 9/1993 | Kawaguchi et al. ................... 349/60 |
| 5,867,235 | * | 2/1999 | Hasegawa .............................. 349/58 |
| 5,905,551 | * | 5/1999 | Sanpei et al. .......................... 349/60 |

* cited by examiner

Primary Examiner—James A. Dudek
(74) Attorney, Agent, or Firm—Baniak Pine & Gannon

(57) ABSTRACT

An apparatus for mounting a LCD assembly onto a printed circuit board is provided. The LCD assembly includes a LCD electrically connected to a LCD board for controlling the LCD. A rigid connector includes first and second ends, each of the ends including a plurality of conductive pins. The first end is connected to the LCD board. A printed circuit board connector includes a first end connected to the printed circuit board and a second end having a plurality of openings formed therein. The second end of the rigid connector is received in the openings of the printed circuit board connector. A LCD board connector may be provided which is connected to the LCD board and which receives the first end of the rigid connector. At least a portion of the rigid connector may be encapsulated by a ferrite material to reduce electromagnetic emissions. A housing may be provided for supporting at least a portion of the LCD assembly and for mounting onto the printed circuit board.

19 Claims, 2 Drawing Sheets

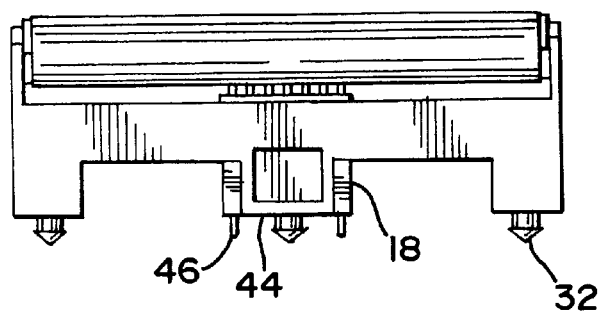
FIG.3
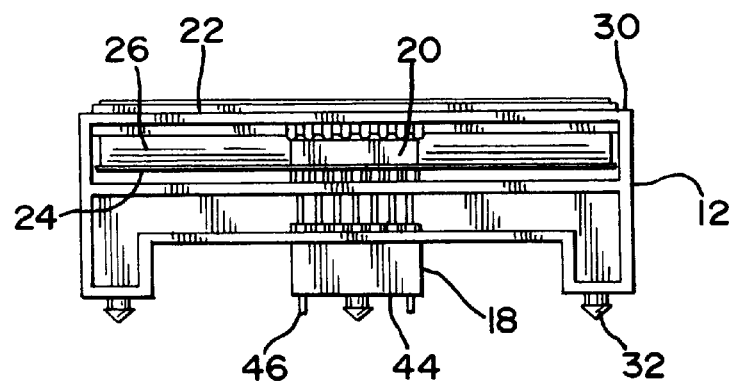
FIG.4
FIG.5
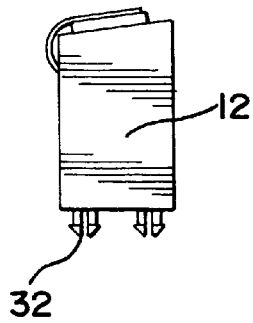
FIG.6
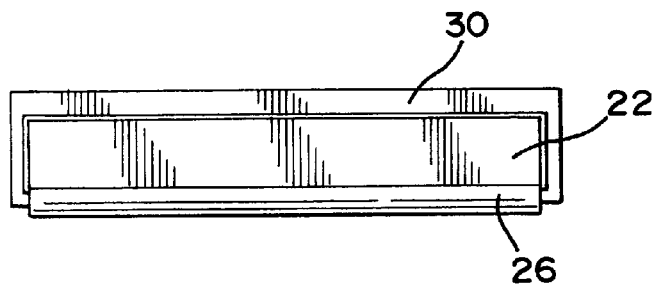
FIG.7
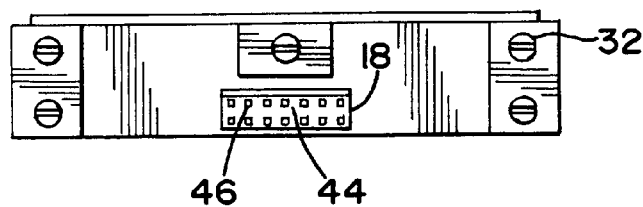

APPARATUS AND METHOD FOR MOUNTING A LIQUID CRYSTAL DISPLAY (LCD) ASSEMBLY ONTO A PRINTED CIRCUIT BOARD

FIELD OF THE INVENTION

The present invention relates generally to the field of liquid crystal displays and, in particular, to an improved apparatus and method for mounting a liquid crystal display onto a printed circuit board.

BACKGROUND OF THE INVENTION

Liquid crystal display assemblies are available which can be electrically connected to a printed circuit board of a wide variety of electronic devices such as speaker phones, facsimile machines, VCR's, etc. Typically, these assemblies include a liquid crystal display (LCD) which is electrically connected to a dedicated printed circuit board which controls the LCD. The LCD assemblies are then electrically connected to the printed circuit board of the electronic device by a flexible ribbon cable. One end of the ribbon cable is integrally connected to the printed circuit board of the LCD assembly. The other end of the ribbon cable has a terminal end which is manually inserted into a socket mounted on the printed circuit board of the electronic device. Typically, a ribbon cable length of approximately 10 inches is required to account for the distance between the location of the LCD assembly (which is usually located near the outer housing of the device) and the printed circuit board of the device (which usually located well inside the device away from the outer housing).

This arrangement has certain disadvantages. The ribbon cable has certain characteristics of an antenna and radiates electromagnetic emissions. These emissions increase dramatically as the length of the ribbon cable increases. A typical ribbon cable length of 10 inches results in the creation of unacceptable levels of electromagnetic emissions in certain devices which in turn can interfere with their electronics. Moreover, the method of assembly is complicated due to the fact a technician must perform two steps: (1) manually installing the LCD assembly at a location adjacent the outer housing of the device and (2) manually inserting the terminal end of the ribbon cable into the socket which is mounted on the printed circuit board of the device. Inserting the terminal end of the ribbon cable into the socket to obtain a satisfactory connection is oftentimes difficult and time consuming because the terminal end of the ribbon cable is flexible whereas the socket is rigid. Moreover, after the connection has been made, the technician must spend a considerable amount of time manipulating the excess ribbon cable and packaging it so that it fits within the confines of the exterior shell of the device and does not interfere with the other internal components of the device.

Accordingly, it would be desirable to have a LCD apparatus that overcomes the disadvantages described above and to provide a simple and cost effective LCD apparatus.

SUMMARY OF THE INVENTION

One aspect of the invention provides an apparatus for mounting a LCD onto a printed circuit board. A LCD assembly includes the LCD electrically connected to a LCD board for controlling the LCD. A rigid connector electrically connects the LCD assembly to the printed circuit board. At least a portion of the rigid connector may be encapsulated by ferrite material to reduce electromagnetic emissions. The rigid connector may be a board-to-board pin header.

Another aspect of the invention provides an apparatus for mounting a LCD onto a printed circuit board. A LCD assembly includes the LCD electrically connected to a LCD board for controlling the LCD. A housing is provided for supporting at least a portion of the LCD assembly and for mounting onto the printed circuit board. A rigid connector is provided which includes first and second ends, each of the ends has a plurality of conductive pins. The first end is connected to the LCD board and the second end is connected to the printed circuit board. The housing may include an opening for receiving at least a portion of the LCD assembly. At least a portion of the rigid connector may be encapsulated by ferrite material to reduce electromagnetic emissions.

Another aspect of the invention provides an apparatus for mounting a LCD onto a printed circuit board. A LCD assembly includes the LCD electrically connected to a LCD board for controlling the LCD. A rigid connector includes first and second ends. Each of the ends includes a plurality of conductive pins. The first end is connected to the LCD board. A printed circuit board connector includes a first end connected to the printed circuit board and a second end having a plurality of openings formed therein. The second end of the rigid connector is received in the openings of the printed circuit board connector. The printed circuit board connector may be a pin header with through holes. A LCD board connector which is connected to the LCD board and receives the first end of the rigid connector may be provided. The LCD board connector may be a surface mounted connector with through holes. At least a portion of the rigid connector may be encapsulated by a ferrite material to reduce electromagnetic emissions. A housing may be provided for supporting at least a portion of the LCD assembly and for mounting onto the printed circuit board.

Another aspect of the invention provides a method of mounting a LCD onto a printed circuit board. A LCD assembly including the LCD electrically connected to a LCD board for controlling the LCD is provided. A rigid connector for electrically connecting the LCD assembly to the printed circuit board is also provided. The rigid connector is electrically connected to the LCD assembly and to the printed circuit board.

Another aspect of the invention provides a method of electrically connecting a LCD assembly to a printed circuit board. A first end of a printed circuit board connector is connected to the printed circuit board. The first end of a rigid connector is connected to the LCD assembly. The second end of the rigid connector is inserted into a second end of the printed circuit board connector.

Another aspect of the invention provides a method of mounting a LCD assembly onto a printed circuit board. The LCD assembly is inserted into an opening formed within a housing. A first end of a rigid connector is electrically connected to the LCD assembly. A second end of the rigid connector is electrically connected to the printed circuit board. The housing is mounted onto the printed circuit board.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which are defined by the appended claims and equivalents thereof.

BRIEF DESCRIPTION OF THE DRAWINGS

FIG. 3 is a front view of the LCD apparatus of FIG. 1;

FIG. 4 is a back view of the LCD apparatus of FIG. 1;

FIG. 5 is a side view of the LCD apparatus of FIG. 1;

FIG. 6 is a top view of the LCD apparatus of FIG. 1;

FIG. 7 is a bottom view of the LCD apparatus of FIG. 1.

DETAILED DESCRIPTION OF THE PRESENTLY PREFERRED EMBODIMENTS

Figure 1:
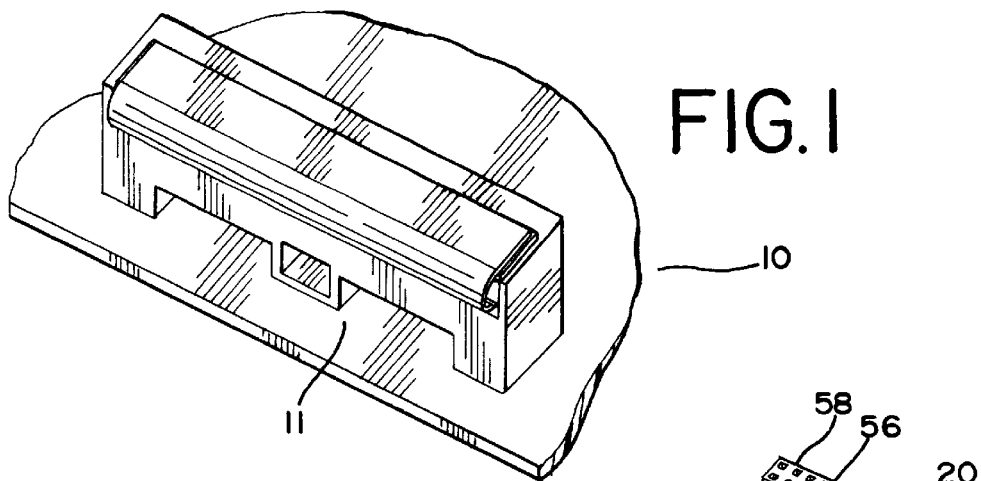
FIG. 1 is a perspective view of a preferred embodiment of a LCD apparatus made in accordance with the invention.
Figure 2:
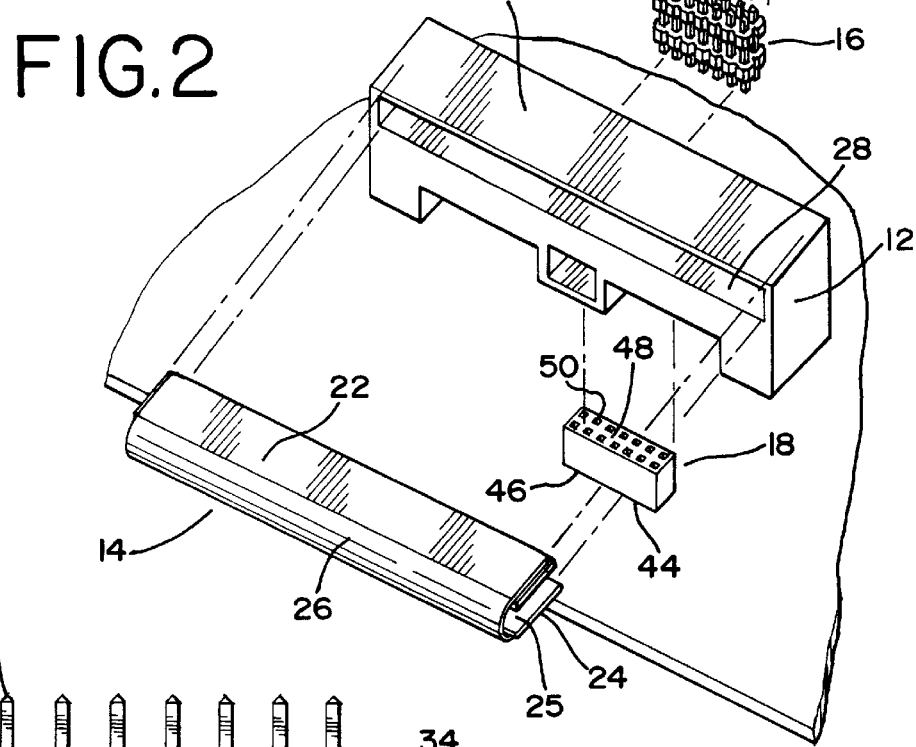
FIG. 2 is an exploded view of FIG. 1.

Referring to FIGS. 1 and 2, a preferred embodiment of a liquid crystal display (LCD) apparatus 10 includes a housing 12, a LCD assembly 14, a rigid connector 16, a printed circuit board connector 18, and a LCD board connector 20. For the embodiment shown, the LCD assembly 14 includes a LCD 22, a LCD board 24 for controlling the LCD 22 and a ribbon cable 26 for electrically connecting the LCD board 24 to the LCD 22. In a preferred embodiment, the LCD board 24 is a printed circuit board which may vary in size depending on the particular functions to be performed. Similarly, the LCD 22 may vary in size depending on the amount of data to be displayed. The LCD assembly 14 may be any of the readily available, standard LCD assemblies including those manufactured by Varitronix Limited.

FIGS. 1–7 show the housing 12 which incorporates a presently preferred embodiment of this invention. The housing 12 preferably includes an opening 28 to receive the LCD board 24 of the LCD assembly 14. When the LCD board 24 is inserted into the opening 28, the LCD 22 is secured to the top surface 30 of the housing 12. Any conventional means may be used to secure the LCD 22 to the top surface 30 of housing 12, including, for example, adhesive or Velcro. As shown on FIGS. 3–5, and 7, the housing 12 includes board locks 32 which function to secure the housing 12 to the printed circuit board 11 of the electronic device. The housing 12 is made of any rigid material, including metal or plastic. In the embodiment shown, for example, the housing 12 is preferably made of ABS plastic. Moreover, the size of opening 28 may vary in order to receive a LCD board 24 of one of varying sizes.

Figure 2A:
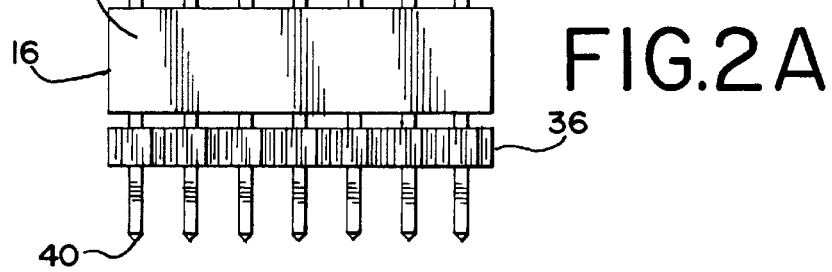
FIG. 2a is a front view of the rigid connector of the embodiment of FIG. 2.

FIGS. 2–4 show the rigid connector 16 which incorporates a presently preferred embodiment of this invention. As shown in FIG. 2a, the rigid connector 16 has a first end 34 including a plurality of conductive pins 38 and a second end 36 including a plurality of conductive pins 40. In a preferred embodiment of this invention as shown in FIG. 2a, a portion of the rigid connector 16 is encapsulated by a ferrite material 42 which results in the reduction of electromagnetic emissions. The rigid connector 16 may be any of the readily available, standard rigid connectors, including, for example, a board-to-board pin header manufactured by Samtec USA. The rigid connector 16 is preferably made of any rigid material, including plastic. In the embodiment shown, for example, the rigid connector 16 is preferably made of ABS plastic. The rigid connector 16 provides an efficient and secure means for connecting one electronic component to another.

FIGS. 2, 3–4, and 7 show the printed circuit board connector 18 which incorporates a presently preferred embodiment of this invention. The printed circuit board connector 18 has a first end 44 including a plurality of conductive pins 46 for connection to a printed circuit board 11 and a second end 48 having a plurality of openings 50 formed therein for receiving the pins 40 of the rigid connector 16. The printed circuit board connector 18 may be any of the readily available, standard printed circuit board connectors, including, for example, a pin header with through holes manufactured by Samtec USA. The printed circuit board connector 18 is preferably made of any rigid material including plastic. In the embodiment shown, for example, the printed circuit board connector 18 is preferably made of ABS plastic.

FIGS. 2 and 4 show the LCD board connector 20 which incorporates a presently preferred embodiment of this invention. The LCD board connector 20 has a first end 52 including a plurality of conductive pins 54 for mounting to the top surface 25 of the LCD board 24 and a second end 56 having a plurality of openings 58 formed therein for receiving pins 38 of the rigid connector 16. The LCD board connector 20 may be any of the readily available, standard LCD board connectors, including, for example, a low profile surface mounted connector with through holes manufactured by Samtec USA. The LCD board connector 20 is preferably made of any rigid material including plastic. In the embodiment shown, for example, the LCD board connector 18 is preferably made of ABS plastic.

The apparatus of FIGS. 1–7 is used for mounting a LCD assembly 14 onto a printed circuit board 11. The LCD board 24 is preferably inserted into the opening 28 of housing 12. The LCD display 22 is secured to the top surface 30 of housing 12. The first end 34 of the rigid connector 16 is preferably connected directly to the LCD board 24 by inserting the pins 38 of the rigid connector 16 into plated holes (not shown) in the LCD board 24 and soldering the pins 38 to the LCD board 24. Alternatively, the pins 38 of the first end 34 of the rigid connector 16 are inserted into the openings 58 of the LCD board connector 20.

The pins 40 of the second end 36 of the rigid connector 16 are connected to a printed circuit board 11. The pins 40 may be fixedly soldered to the printed circuit board 11. Preferably, the pins 40 are inserted into the openings 50 of the printed circuit board connector 18.

The housing 12 is preferably mounted to the printed circuit board 11 and locked in place by board locks 32. Openings in the printed circuit board 11 which receive the board locks 32 are spatially oriented relative to the printed circuit board connector 18 so that when the housing 12 is mounted onto the printed circuit board 11, the pins 40 of the rigid connector 16 are inserted in the openings 50 of the printed circuit board connector 18. The LCD apparatus 10 provides for a single, easy to install LCD unit which can be quickly mounted onto a printed circuit board of an electronic device in a cost effective manner.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

I claim:

1. An apparatus for mounting a liquid crystal display (LCD) onto a printed circuit board comprising:
   a LCD assembly including the LCD electrically connected to a LCD board controller controlling the operation of the LCD; and
   a rigid connector electrically connecting the LCD assembly to the printed circuit board.

2. The apparatus of claim 1 wherein at least a portion of the rigid connector is encapsulated by ferrite material to reduce electromagnetic emissions.

3. The apparatus of claim 1 wherein the rigid connector comprises a board-to-board pin header.

4. An apparatus for mounting a liquid crystal display (LCD) onto a printed circuit board comprising:
   a LCD assembly including the LCD electrically connected to a LCD board for controlling the LCD;
   a housing supporting at least a portion of the LCD assembly and mounted onto the printed circuit board; and
   a rigid connector including first and second ends, each of the ends having a plurality of conductive pins, the first end connected to the LCD board, the second end connected to the printed circuit board.

5. The apparatus of claim 4 wherein the housing includes an opening for receiving at least a portion of the LCD assembly.

6. The apparatus of claim 4 wherein at least a portion of the rigid connector is encapsulated by ferrite material to reduce electromagnetic emissions.

7. An apparatus for mounting a liquid crystal display (LCD) onto a printed circuit board comprising:
   a LCD assembly including the LCD electrically connected to a LCD board for controlling the LCD;
   a rigid connector including first and second ends, each of the ends including a plurality of conductive pins, the first end connected to the LCD board; and
   a printed circuit board connector including a first end connected to the printed circuit board and a second end having a plurality of openings formed therein, the second end of the rigid connector received in the openings of the printed circuit board connector.

8. The apparatus of claim 7 further comprising a LCD board connector connected to the LCD board and receiving the first end of the rigid connector.

9. The apparatus of claim 8 wherein the LCD board connector comprises a surface mounted connector with through holes.

10. The apparatus of claim 7 wherein the printed circuit board connector comprises a pin header with through holes.

11. The apparatus of claim 7 wherein at least a portion of the rigid connector is encapsulated by a ferrite material to reduce electromagnetic emissions.

12. The apparatus of claim 7 further comprising a housing for supporting at least a portion of the LCD assembly and for mounting onto the printed circuit board.

13. A method of mounting a liquid crystal display (LCD) onto a printed circuit board, the method including the following steps:
   providing an apparatus for mounting a LCD onto a printed circuit board, the apparatus including:
   a LCD assembly including the LCD electrically connected to a LCD board for controlling the LCD, and a rigid connector for electrically connecting the LCD assembly to the printed circuit board; and
   electrically connecting the rigid connector to the LCD assembly and to the printed circuit board.

14. A method of electrically connecting a liquid crystal display (LCD) assembly to a printed circuit board comprising:
   connecting a first end of a printed circuit board connector to the printed circuit board;
   connecting a first end of a rigid connector to the LCD assembly; and
   inserting a second end of the rigid connector into a second end of the printed circuit board connector.

15. A method of mounting a liquid crystal display (LCD) assembly onto a printed circuit board comprising:
   inserting the LCD assembly into an opening formed within a housing;
   electrically connecting a first end of a rigid connector to the LCD assembly;
   electrically connecting a second end of the rigid connector to the printed circuit board; and
   mounting the housing onto the printed circuit board.

16. An apparatus for mounting a liquid crystal display (LCD) onto a printed circuit board comprising:
   a LCD assembly including the LCD electrically connected to a LCD board for controlling the LCD; and
   a rigid connector for electrically connecting the LCD assembly to the printed circuit board wherein at least a portion of the rigid connector is encapsulated by ferrite material to reduce electromagnetic emissions.

17. An apparatus for mounting a liquid crystal display (LCD) onto a printed circuit board comprising:
   a LCD assembly including the LCD electrically connected to a LCD board for controlling the LCD;
   a housing for supporting at least a portion of the LCD assembly and for mounting onto the printed circuit board; and
   a rigid connector including first and second ends, each of the ends having a plurality of conductive pins, the first end connected to the LCD board, the second end connected to the printed circuit board wherein at least a portion of the rigid connector is encapsulated by ferrite material to reduce electromagnetic emissions.

18. An apparatus for mounting a liquid crystal display (LCD) onto a printed circuit board comprising:
   a LCD assembly including the LCD electrically connected to a LCD board for controlling the LCD; and
   a rigid connector electrically connecting the LCD assembly to the printed circuit board wherein at least a portion of the rigid connector is encapsulated by ferrite material to reduce electromagnetic emissions.

19. An apparatus for mounting a liquid crystal display (LCD) onto a printed circuit board comprising:
   a LCD assembly including the LCD electrically connected to a LCD board for controlling the LCD; and
   a rigid connector for electrically connecting the LCD assembly to the printed circuit board wherein the rigid connector comprises a board-to-board pin header.

* * * * *